United States Patent
Tajima

[19]

[11] Patent Number: 6,075,377
[45] Date of Patent: Jun. 13, 2000

[54] METHOD OF CONFIRMING CONNECTING STATES OF SIGNAL TERMINALS IN A SEMICONDUCTOR DEVICE

[75] Inventor: Fumihiko Tajima, Tokyo, Japan

[73] Assignee: NEC Corporation, Tokyo, Japan

[21] Appl. No.: 09/052,479

[22] Filed: Mar. 31, 1998

[51] Int. Cl.[7] .................................................. G10R 31/26
[52] U.S. Cl. .......................................... 324/765; 324/763
[58] Field of Search ................................. 324/158.1, 763, 324/765; 714/25, 732, 733

[56] References Cited

U.S. PATENT DOCUMENTS

| | | | |
|---|---|---|---|
| 5,371,457 | 12/1994 | Lipp | 324/158.1 |
| 5,414,352 | 5/1995 | Tanase | 324/158.1 |
| 5,485,095 | 1/1996 | Bertsch et al. | 324/537 |
| 5,543,728 | 8/1996 | Grace et al. | 324/763 |

FOREIGN PATENT DOCUMENTS

| | | |
|---|---|---|
| 54-48176 | 4/1979 | Japan . |
| 5-190637 | 7/1993 | Japan . |

*Primary Examiner*—Josie Ballato
*Assistant Examiner*—Russell M. Kobert

[57] ABSTRACT

A connecting state of a signal terminal provided in a semiconductor device is confirmed by externally applying a voltage through a resistor to the signal terminal and detecting a voltage value range in which a voltage value measured at the signal terminal falls. Although the number of measurements of voltage value at the signal terminals to be tested is increased compared with the conventional method, the time necessary for each measurement is very short and it is possible to substantially reduce the total test time.

3 Claims, 6 Drawing Sheets

|  | $V_{DD}$ Short-Circuited | GND Short-Circuited | Opened | Short-Circuited to Adjacent Terminal | Normal Connection |
|---|---|---|---|---|---|
| Voltage at Terminal to be Tested | 0V | 0V | 1V | 0.1V | 0.2V |

FIG.4

METHOD OF CONFIRMING CONNECTING STATES OF SIGNAL TERMINALS IN A SEMICONDUCTOR DEVICE

BACKGROUND OF THE INVENTION

1. Field of the Invention

The present invention relates to a testing method for testing a semiconductor device and, particularly, to a testing method for confirming a connecting state of signal terminals provided in a semiconductor device.

2. Description of Related Art

As a method for confirming a connecting state of signal terminals provided in a semiconductor, it has been usual to supply a current to each signal terminal and measure voltage values at the respective signal terminals. Such conventional testing method will be described with reference to FIG. 1. In FIG. 1, an LSI 101 is used as a semiconductor device which has a plurality of signal terminals 103-1 to 103-$n$ and a plurality of $V_{DD}$ terminals 105-$l$ to 105-$n$ to which a power source voltage is applied. The signal terminal 103 -$i$ ($i$=1~$n$) is connected to the $V_{DD}$ terminal 105-$i$ through a protective diode 104$a$-$i$ and to a GND terminal 106-$i$ through a protective diode 104$b$-$i$. A case where the signal terminal 103-1 is a terminal to be measured will be described.

First, the voltage values of the $V_{DD}$ terminals 105-1 to 105-$n$ are made 0V. Then, a constant voltage is applied from a tester 102 to the signal terminals other than the signal terminal 103-1 which is the terminal to be tested. Thereafter, a current is supplied from the tester 102 to the signal terminal 103-1 and a voltage value at the signal terminal 103-1 is measured.

When the measured voltage value at the signal terminal 103-1 is 0V, it is judged that the signal terminal 103-1 is short-circuited to the $V_{DD}$ terminal 105-1 or the GND terminal 106-1. When the measured voltage value at the signal terminal 103-1 is a clamp voltage (usually, equal to or higher than 1V), it is judged that the signal terminal 103-1 is opened. When the measured voltage at the signal terminal 103-1 is equal to the voltage value applied to the signal terminals 103-2 to 103-$n$ other than the signal terminal 103-1, it is judged that the signal terminal 103-1 is short-circuited to at least one of the signal terminals 103-2 to 103-$n$. When the measured voltage of the signal terminal 103-1 is 0.3~0.6V which is a voltage drop due to the forward characteristics of the protective diodes 104$a$-1 and 104$b$-1, it is judged that the signal terminal 103-1 is connected normally.

FIG. 2 shows an example of the testing time in the prior art testing method mentioned above. The mass-productivity of semiconductor device is becoming more and more important with the recent expansion of semiconductor market. Therefore, in order to realize the required mass-productivity of semiconductor device, a speedup of not only the manufacture of semiconductor device but also the test thereof is indispensable. In the prior art testing method, however, it takes about several milliseconds to test the connecting state of each signal terminal of the semiconductor device. Therefore, in order to test a semiconductor device which has a more complicated structure and an increased number of pins, a considerable time is necessary and the speedup of testing becomes difficult.

SUMMARY OF THE INVENTION

An object of the present invention is to provide a test method for confirming the connecting state of a plurality of signal terminals provided in a semiconductor device in a mininum time.

According to the present invention, a connecting state of signal terminals of a semiconductor device is confirmed by externally applying a voltage to each of the signal terminals through a resistor and detecting a range of voltage in which a voltage value of the signal terminal falls.

A voltage value which is detected at a signal terminal of the signal terminals provided in the semiconductor device, which is to be tested, if the signal terminal is in a normal connecting state when a voltage is applied to a signal terminal to be tested is preliminarily set as a first setting value. A power source terminal of the semiconductor device is grounded and a bias voltage which is lower than the first setting value is applied to the signal terminals other than the signal terminal to be tested. When the voltage value measured at the signal terminal to be tested is equal to or higher than the first setting value, it is judged that the signal terminal to be tested is opened or connected normally. When the measured voltage value of the signal terminal to be tested is lower than the first setting value, it is judged that the signal terminal to be tested is short-circuited to the GND terminal or the power source terminal of the semiconductor device or to one of the signal terminals other than the signal terminal to be tested.

A voltage value lower than the bias voltage of the other signal terminals is preliminarily set as a second setting value. When the measured voltage value of the signal terminal to be tested is equal to or lower than the second setting value, it is judged that the signal terminal to be tested is short-circuited to the GND terminal or the power source terminal and, when the measured voltage value of the signal terminal to be tested is lower than the first setting value and higher than the second setting value, it is judged that the signal terminal to be tested is short-circuited to one of the signal terminals other than the signal terminal to be tested.

A voltage value lower than the first setting and higher than the voltage applied to the signal terminal to be tested through the resistor is preliminarily set as a third setting value and, when the voltage value of the signal terminal to be tested is equal to or higher than the first setting value and equal to or smaller than the third setting value, it is judged that the signal terminal to be tested is connected normally. When the voltage value of the signal terminal to be tested exceeds the third setting value, it is judged that the signal terminal to be tested is opened.

BRIEF DESCRIPTION OF THE DRAWINGS

The foregoing and other objects, features and advantages of the present invention will become more apparent by reference to the following detailed description of the invention taken in conjunction with the accompanying drawings, wherein:

FIG. 4 is a table showing an example of measured voltage values at one of a plurality of signal terminals of a semiconductor and connecting states of the signal terminal to be tested, in the testing method shown in FIG. 3;

DETAILED DESCRIPTION OF THE PREFERRED EMBODIMENTS

Figure 1:
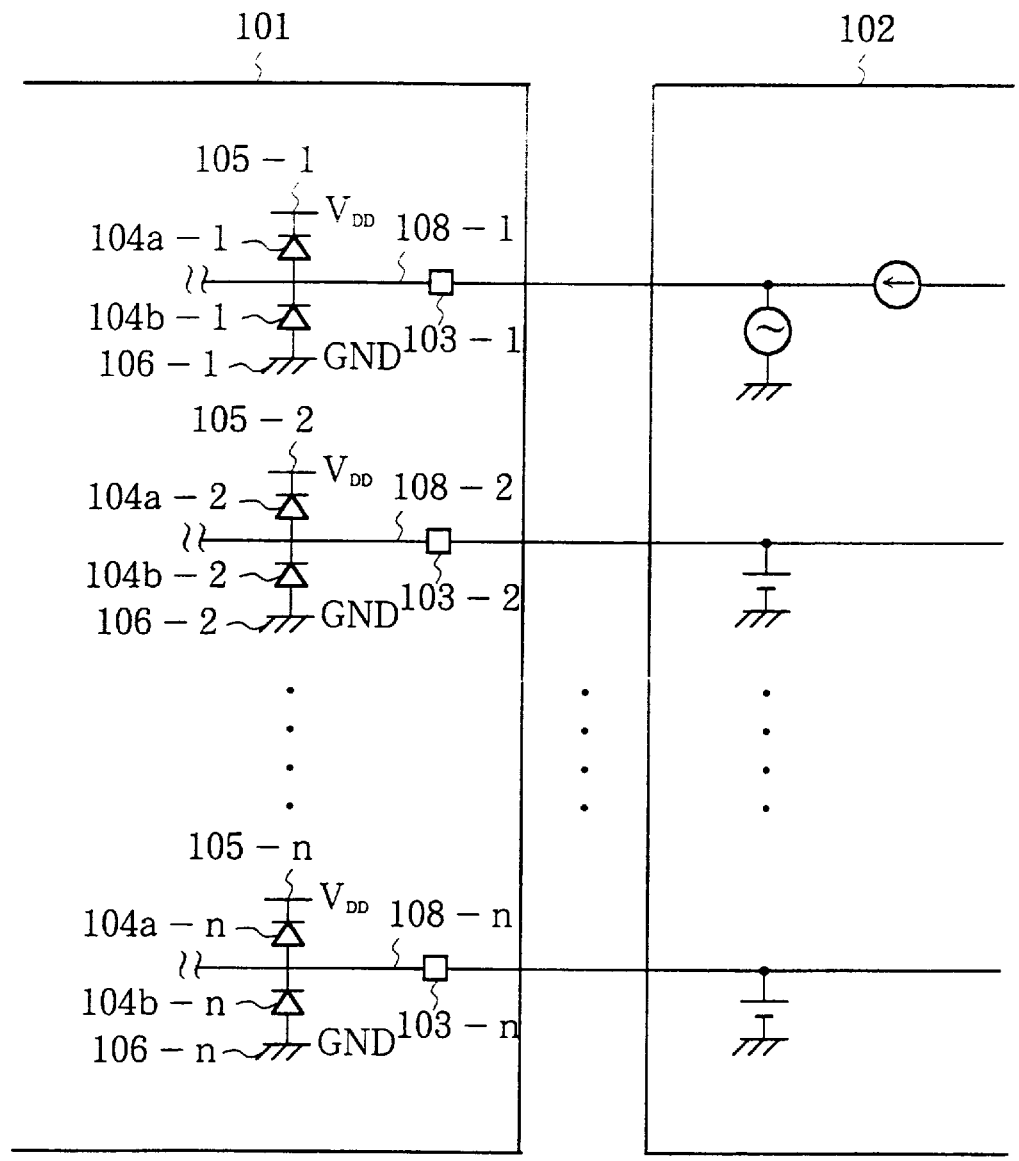
FIG. 1 is an illustration explaining an example of a conventional testing method for a semiconductor device.
Figure 2:
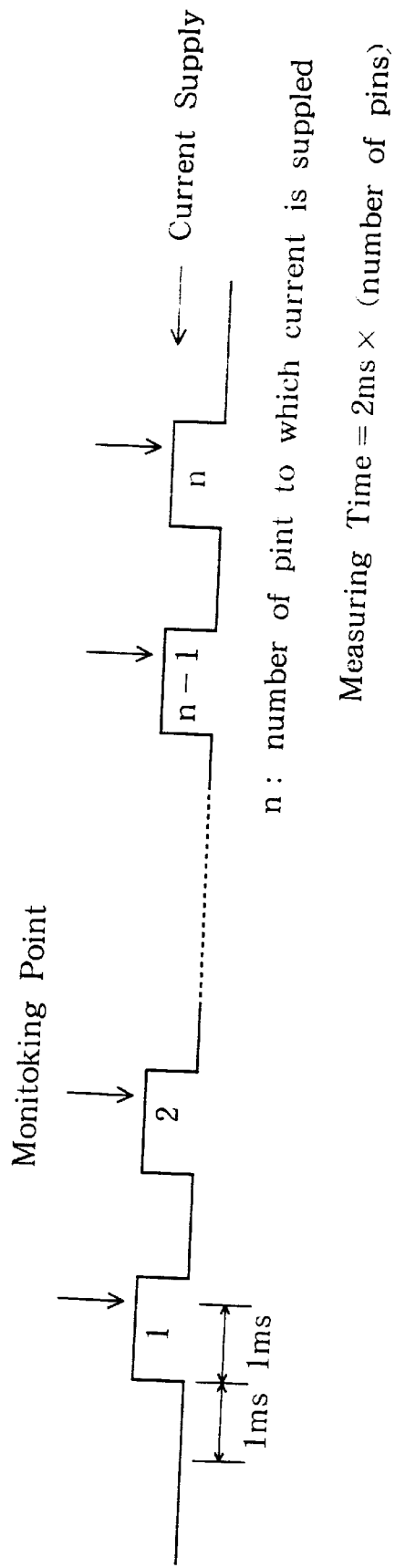
FIG. 2 is a time series of the testing according to the conventional testing method for a semiconductor device.
Figure 3:
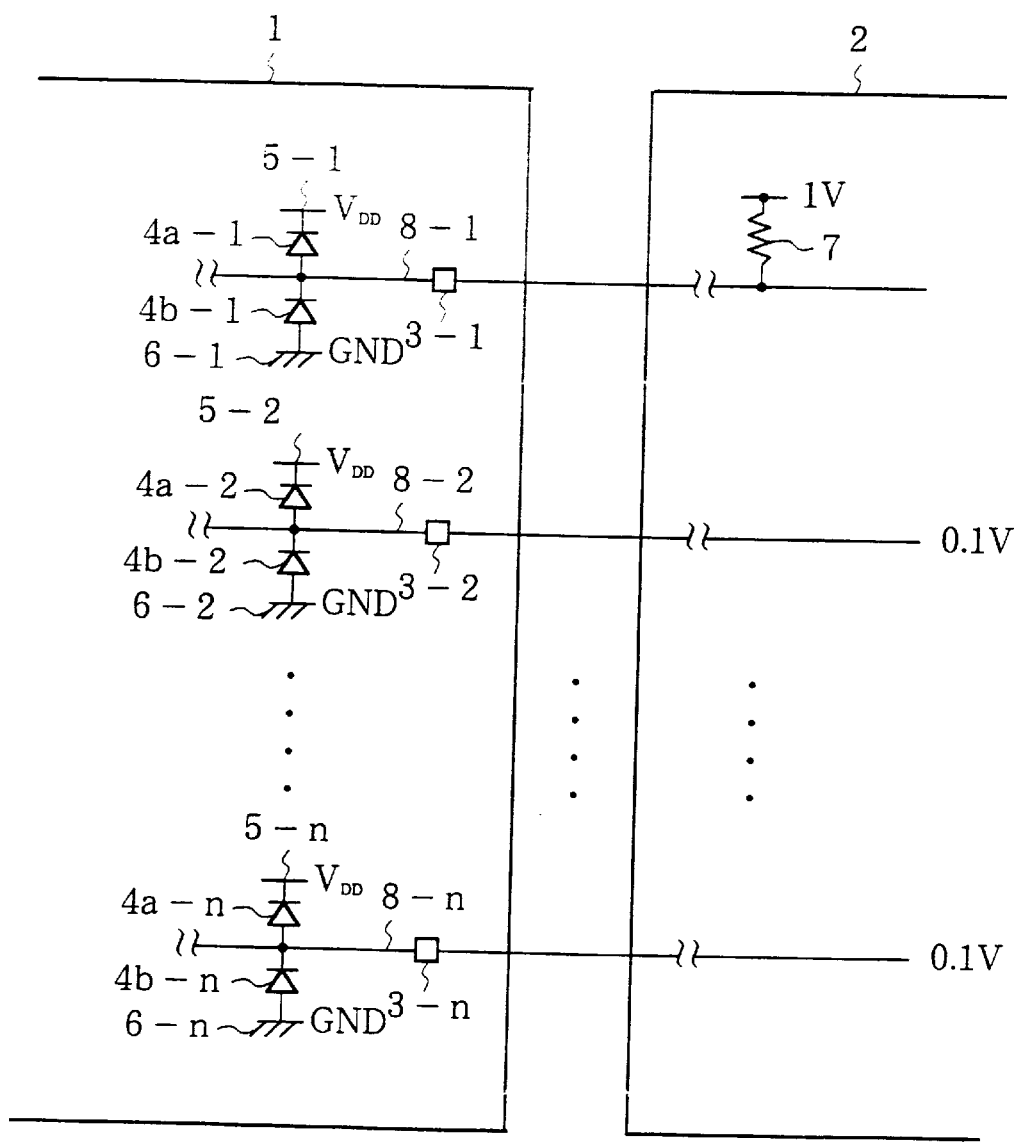
FIG. 3 shows an embodiment of a testing method for a semiconductor device, according to the present invention.

FIG. 3 shows an embodiment of the present invention. In FIG. 3, a semiconductor device to be tested is shown as an LSI 1 and a reference numeral 2 depicts a tester for testing the LSI 1. The LSI 1 is provided with signal terminals 3-1~3-n and $V_{DD}$ terminals 5-1~5-n which are power source terminals to which a source voltage is applied. An internal wiring 8-i (i=1~n) is connected to the signal terminal 3-i. The internal wiring 8-i is connected to the $V_{DD}$ terminal 5-i through a protective diode 4a-i and to a GND terminal 6-i through a protective diode 4b-i. The present invention will be described with respect to a case where the signal terminal 3-1 is to be tested.

First, a voltage value of the $V_{DD}$ terminals 5-1~5-n is made 0V. Secondly, a constant voltage of 0.1V is applied to the signal terminals 3-2~3-n other than the signal terminal 3-1 to be tested. In this state, a voltage of 1V is applied from the tester 2 through an internal resistor 7 thereof to the signal terminal 3-1 and, simultaneously, a voltage value at the signal terminal 3-1 is measured.

FIG. 4 is a table showing an example of a relation between measured voltage values of the signal terminal to be tested and connecting states thereof. As shown in the table in FIG. 4, the measured voltage value at the signal terminal 3-1 becomes 0V when the internal wiring 8-1 and the $V_{DD}$ terminal 5-1 or the GND terminal 6-1 to which the signal terminal 3-1 is connected is short-circuited. On the other hand, when the internal wiring 8-1 is opened, the measured voltage value of the signal terminal 3-1 becomes 1V. In the case where the internal wiring 8-1 is short-circuited to one of the other signal terminals 3-2~3-n, the measured voltage value at the signal terminal 3-1 becomes 0.1V. When the internal wiring 8-1 is connected to the signal terminal 3-1 normally, the measured voltage value at the signal terminal 3-1 becomes 0.2~0.3V which depends upon the characteristics of the protective diodes 4a-1 and 4b-1.

Figure 5:
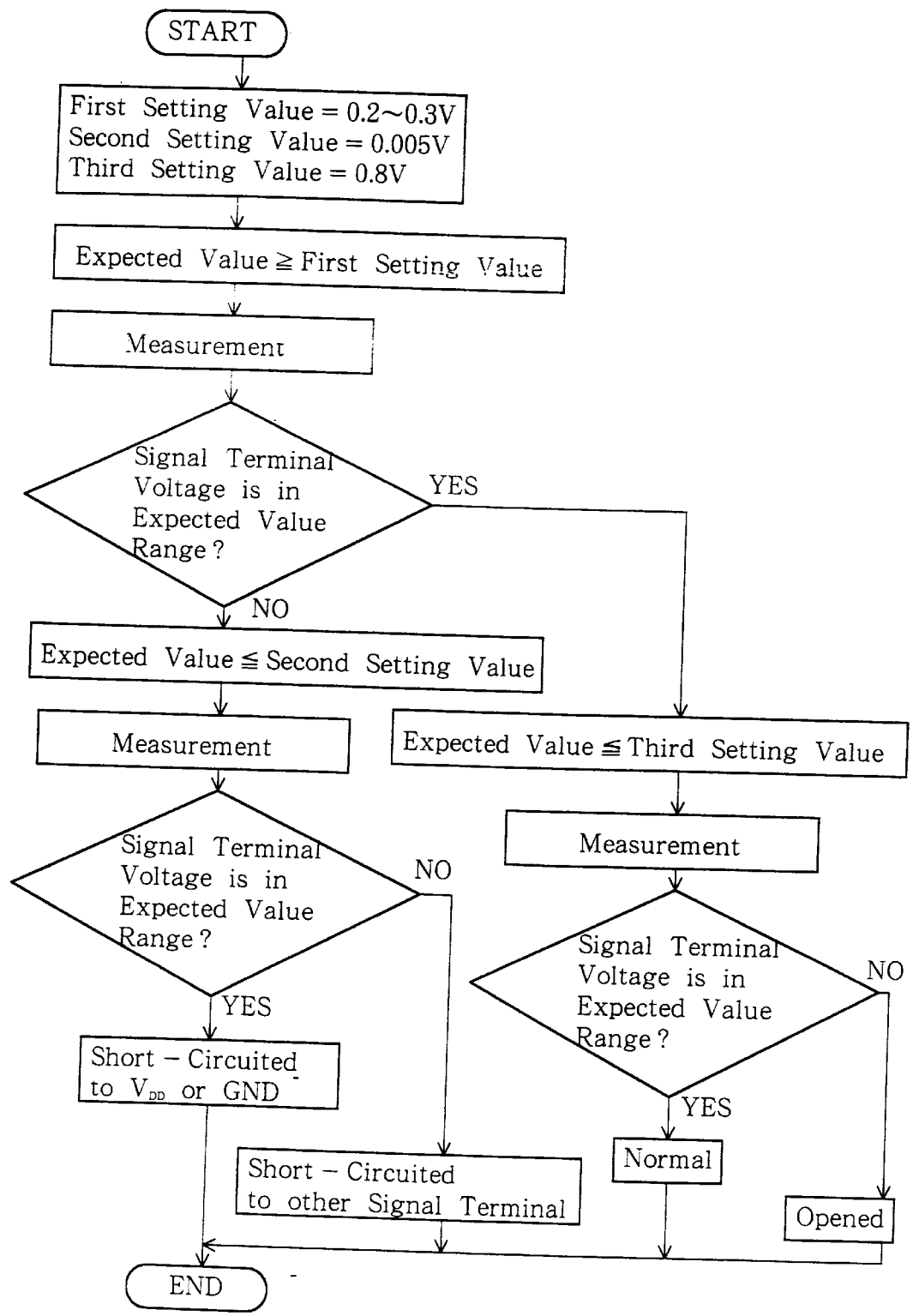
FIG. 5 is a flowchart showing procedures of the testing method according to the present invention.

In the present invention, no current is supplied to the signal terminal 3-1 to be tested. That is, the voltage is applied to the signal terminal 3-1 through the resistor and not a voltage value but a range of the measured voltage value is detected. The testing method of the present invention will be described with reference to FIG. 5.

Initially, a voltage value which is to be measured at the signal terminal 3-1 in the normal connecting state when the voltage is applied thereto, that is, 0.2~0.3V which depends upon the characteristics of the protective diodes 4a-1 and 4b-1, is set as a first setting value. Similarly, a voltage value which is smaller than the bias voltage applied to the signal terminals 3-2~3-n other than the signal terminal 3-1 to be measured, for example, 0.005V, is set as a second setting value and a voltage value which is larger than the first setting value and smaller than the voltage applied to the signal terminal 3-1 through the internal resistor 7, for example, 0.8V, is set as a third setting value.

In this state, a range of expected voltage value equal to or larger than the first setting value (0.2~0.3V) is set and it is detected whether or not the measured voltage value at the signal terminal 3-1 is within the range of expected value. When the measured voltage is within the expected value range, that is, when the measured voltage is equal to or higher than 0.2~0.3V, it is judged from the table shown in FIG. 4 that the internal wiring associated with the signal terminal 3-1 is normally connected or opened. On the contrary, when the measured voltage is outside the expected voltage range, it is clear that the internal wiring 8-1 is short-circuited to the $V_{DD}$ terminal 5-1, the GND terminal 6-1 or at least one of the other signal terminals 3-2~3-n.

In the case where the internal wiring 8-1 is short-circuited to the $V_{DD}$ terminal 5-1, the GND terminal 6-1 or at least one of the other signal terminals 3-2~3-n, the expected voltage range is switched to a second range which is equal to or smaller than the second setting value and it is detected whether or not the measured voltage at the signal terminal 3-1 is within the second voltage range. When the measured voltage value at the signal terminal 3-1 is within the second expected voltage range, it is clear from the table shown in FIG. 4 that the internal wiring 8-1 is short-circuited to the $V_{DD}$ terminal 5-1 or the GND terminal 6-1 and, when the measured voltage is outside the second expected voltage range, it is clear that the internal wiring 8-1 is short-circuited to at least one of the signal terminals 3-2~3-n.

By this testing, it is possible to detect whether or not the internal wiring 8-1 is short-circuited to the $V_{DD}$ terminal 5-1, the GND terminal 6-1 and other signal terminals 3-2~3n.

When the internal wiring 8-1 is normally connected or opened, the expected voltage range is switched to a third voltage range equal to or lower than the third setting value, that is, 0.8V. When the measured voltage at the signal terminal 3-1 is within the third expected voltage range, it is clear from the table shown in FIG. 4 that the internal wiring 8-1 is normally connected and, when the measured voltage at the signal terminal 3-1 is outside the third expected voltage range, it is also clear from FIG. 4 that the internal wiring 8-1 is opened.

The procedures of the present testing method mentioned above are shown by a flowchart in FIG. 5.

Figure 6:
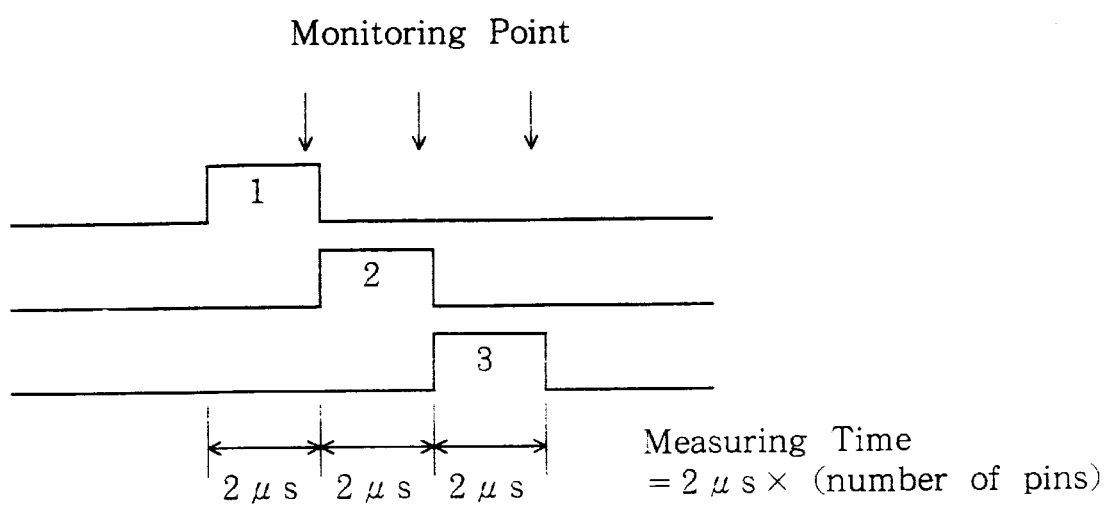
FIG. 6 shows an example of a time series of the testing method according to the present invention.

FIG. 6 shows an example of the time series of the testing method according to the present invention. In the present invention, the voltage measurement at the signal terminal to be tested is performed by not supplying a current thereto but applying a voltage thereto. Further, since the voltage value itself is not measured exactly but it is determined whether or not the measured voltage value is within a expected voltage range, it is possible to substantially shorten the measuring time for each signal terminal to in the order of several micro seconds. Therefore, although the number of measurements of voltage values at signal terminals to be measured is two or three times that in the conventional method, a total testing time is substantially reduced.

What is claimed is:

1. A testing method for confirming a connecting state of a signal terminal provided in a semiconductor device and to be tested, comprising the steps of:

grounding a power source terminal of said semiconductor device through a GND terminal of said semiconductor device and applying a bias voltage lower than a first value to other signal terminals provided in said semiconductor device than said signal terminal to be tested;

externally applying a voltage to said signal terminal to be tested through a resistor;

measuring a voltage at said signal terminal to be tested;

judging said signal terminal to be tested as being opened or connected normally when the voltage value measured at said signal terminal to be tested is equal to or larger than said first value and judging said signal terminal to be tested as being short-circuited to said GND terminal, said power source terminal or said other signal terminals when the voltage measured at said signal terminal to be tested is smaller than the first value.

2. A testing method as claimed in claim 1, further comprising steps of:

judging said signal terminal to be tested as being short-circuited to said GND terminal or said power source terminal in a case where the voltage measured at said signal terminal to be tested is equal to or smaller than a second value smaller than said bias voltage; and judging said signal terminal to be tested as being short-circuited to said other signal terminals when the voltage measured at said signal terminal to be tested is larger than the second value.

3. A testing method as claimed in claim 2, further comprising the steps of:

judging said signal terminal to be tested as being normally connected when the voltage measured at said signal terminal to be tested is equal to or smaller than a third value larger than the first value and smaller than the voltage applied to said signal terminal; and judging said signal terminal to be tested as being opened in a case where the voltage measured at said signal terminal to be tested is larger than the third setting value.

* * * * *